United States Patent [19]

Sugiyama

[11] Patent Number: 5,633,190

[45] Date of Patent: May 27, 1997

[54] SEMICONDUCTOR DEVICE AND METHOD FOR MAKING THE SAME

[75] Inventor: Mitsuhiro Sugiyama, Tokyo, Japan

[73] Assignee: NEC Corporation, Tokyo, Japan

[21] Appl. No.: 711,926

[22] Filed: Sep. 11, 1996

Related U.S. Application Data

[62] Division of Ser. No. 526,177, Sep. 11, 1995, Pat. No. 5,587,612.

[30] Foreign Application Priority Data

Sep. 9, 1994 [JP] Japan .................................. 6-215924

[51] Int. Cl.⁶ .................................................. H01L 21/76
[52] U.S. Cl. ............................................ 438/404; 438/691
[58] Field of Search ................................ 437/67, 72, 62, 437/974; 148/DIG. 50

[56] References Cited

U.S. PATENT DOCUMENTS

| | | | |
|---|---|---|---|
| 4,378,630 | 4/1983 | Horng et al. | 437/241 |
| 5,120,675 | 6/1992 | Pollack | 437/69 |

FOREIGN PATENT DOCUMENTS

| | | |
|---|---|---|
| 0113343 | 9/1980 | Japan . |
| 0220444 | 12/1983 | Japan . |
| 0080244 | 5/1985 | Japan . |

OTHER PUBLICATIONS

H. Nishizawa et al., "Fully SiO₂ Isolated High Speed Self–Aligned Bipolar Transistor on Thin SOI", 1991 Symposium on VLSI Technology, Digest of Technical Papers, pp. 51–52.

*Primary Examiner*—Trung Dang
*Attorney, Agent, or Firm*—Young & Thompson

[57] ABSTRACT

Disclosed is a semiconductor device in which dummy regions which are lower than an isolated element region are formed around the isolated element region. Another dummy region which has a height nearly equal to those of element regions may be formed at a non-element-region-existing region, accompanying with lower dummy regions. The method for making the semiconductor device has the steps of suitably forming the element regions and dummy regions on a insulating layer on a substrate, depositing a insulator on the entire surface of the insulating layer and polishing the insulator to obtain a plane surface.

3 Claims, 6 Drawing Sheets

5,633,190

SEMICONDUCTOR DEVICE AND METHOD FOR MAKING THE SAME

This application is a division of application Ser. No. 08/526,177, filed Sep. 11, 1995, now U.S. Pat. No. 5,587,612.

FIELD OF THE INVENTION

This invention relates to a semiconductor device, and more particularly to, a semiconductor device which has a SOI (Silicon on Insulator) structure and relates to a method for making the same.

BACKGROUND OF THE INVENTION

In a conventional semiconductor device, dielectric isolation is performed by LOCOS isolation, trench isolation or the like. Recently, according to a combination of a deep trench provided by the trench method and a SOI structure, it is possible to make a semiconductor device with complete dielectric isolation.

The SOI-type semiconductor device is realized by forming a plurality of semiconductor monocrystalline regions of a silicon or the like on a insulating layer such that they are dielectrically isolated each other, and forming a transistor element thereon. Therefore, when a MOS integrated circuit is formed by employing the SOI structure, latch-up can be prevented since a well structure is not necessary.

On the other hand, since the SOI-type semiconductor device is made by forming elements on the insulating layer and isolating the elements by an insulator inserted therebetween, it is not affected by α rays which are radiated from a radioactive element such as uranium, thorium or the like that is in very small quantity included in a package or the like. Therefore the device can be radiation-proof. Because the SOI structure has some advantages as mentioned above, it has been employed in making a semiconductor device.

In the semiconductor integrated circuit device, the elements such as a transistor, a resistor or the like are not always uniformly disposed in the device, and it may include an element isolated from the other elements due to the design of a circuit or the patterning of a layout. When the silicon oxide film is polished, the resistance to the polishing in the isolated element is less than that in the other elements. Therefore, even if the polishing of the silicon oxide film is properly stopped, a part of the isolated element may be polished, thereby forming an uneven surface.

SUMMARY OF THE INVENTION

Accordingly, it is an object of the invention to provide a semiconductor device in which the heights of elements formed on an insulating layer are substantially equal each other.

It is a further object of the invention to provide a method for making a semiconductor device in which the heights of elements formed on an insulating layer are substantially equal each other.

According to the invention, a semiconductor device, comprises:

a substrate;

an insulating layer formed on the substrate;

a plurality of island semiconductor regions which are formed on the insulating layer and are isolated each other by an insulator, each of the plurality of island semiconductor regions forming a semiconductor element therein; and a dummy semiconductor region which is formed on the insulating layer and is buried in the insulator, wherein the dummy semiconductor region is adjacent to at least one of the plurality of island semiconductor regions and is lower than the plurality of island semiconductor regions.

Further, according to the invention, a semiconductor device, comprises:

a substrate;

an insulating layer formed on the substrate;

a plurality of island semiconductor regions which are formed on the insulating layer and are isolated each other by an insulator, each of the plurality of island semiconductor regions forming a semiconductor element therein; and a first and second dummy semiconductor regions which are formed on the insulating layer and are buried in the insulator, wherein the first dummy semiconductor region is distant from the plurality of island semiconductor regions by the insulator and has a height nearly equal to the plurality of island semiconductor regions, and the second dummy semiconductor region is adjacent to the first dummy semiconductor region and is lower than the first dummy semiconductor region.

According to another aspect of the invention, a method for making a semiconductor device, comprises the steps of:

forming a plurality of island semiconductor regions and a dummy semiconductor region which is lower than the island semiconductor regions by partially removing a semiconductor layer on a insulating layer;

depositing an insulator on the entire surface of the insulator layer to cover the island semiconductor region and the dummy semiconductor region; and polishing the insulator near to the top surfaces of the island semiconductor regions.

Further, according to the invention, a method for making a semiconductor device, comprises the steps of:

forming a plurality of island semiconductor regions, a first dummy semiconductor region which has a height nearly equal to the island semiconductor regions and a second dummy semiconductor region which is lower than the first dummy semiconductor region by partially removing a semiconductor layer on a insulating layer;

depositing an insulator on the entire surface of the insulator layer including the island semiconductor regions, the first and second dummy semiconductor regions to a height higher than the island semiconductor regions; and polishing the insulator near to the top surfaces of the island semiconductor regions.

Still further, a method for making a semiconductor device, comprises the steps of:

forming a plurality of island semiconductor regions by partially removing a semiconductor layer on a insulating layer, wherein at least one of the island semiconductor regions is provided with a trench;

depositing an insulator on the entire surface of the insulating layer including the island semiconductor regions to a height higher than the island semiconductor regions; and polishing the insulator near to the top surfaces of the island semiconductor regions;

wherein the insulator is filled between island semiconductor regions and into the trench.

In the invention, by the existence of the dummy semiconductor region, the insulator for isolating between elements is deposited higher at the dummy semiconductor region. Therefore, in polishing the insulator, the resistance against the polishing over an isolated element increases, thereby the polishing speed decreasing. Thus, the polishing of the semiconductor layer near the isolated element, i.e., the occurrence of an uneven surface on the device can be prevented.

Hereon, even if the height of the dummy semiconductor region is equal to those of element regions, the polishing speed may be decreased. However, in this case, there is a problem as below. When a circuit is configured to provide an element in each element region and equip a wiring, the insulator laid between the wiring and the dummy region is necessarily thinned, thereby the parasitic capacitance between the wiring and the substrate increasing. Therefore, the transmitting speed of a signal is reduced by the increase of the capacitance since a signal transmitted through a wire is forced to charge and discharge to the parasitic capacitance. This brings a serious defect in providing a high-speed integrated circuit.

The invention is intended to avoid this problem. Namely, the height of the dummy region is lower than that of the element region. Thereby, the heights of the respective semiconductor layers including the isolated element can be substantially equal, i.e., realizing a overall plane surface, to reduce the capacitance between the wire and substrate.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a semiconductor device and a method for making the same in the preferred embodiment, the aforementioned conventional device and the method will be explained in FIGS. 1A and 1B.

Figure 1A:
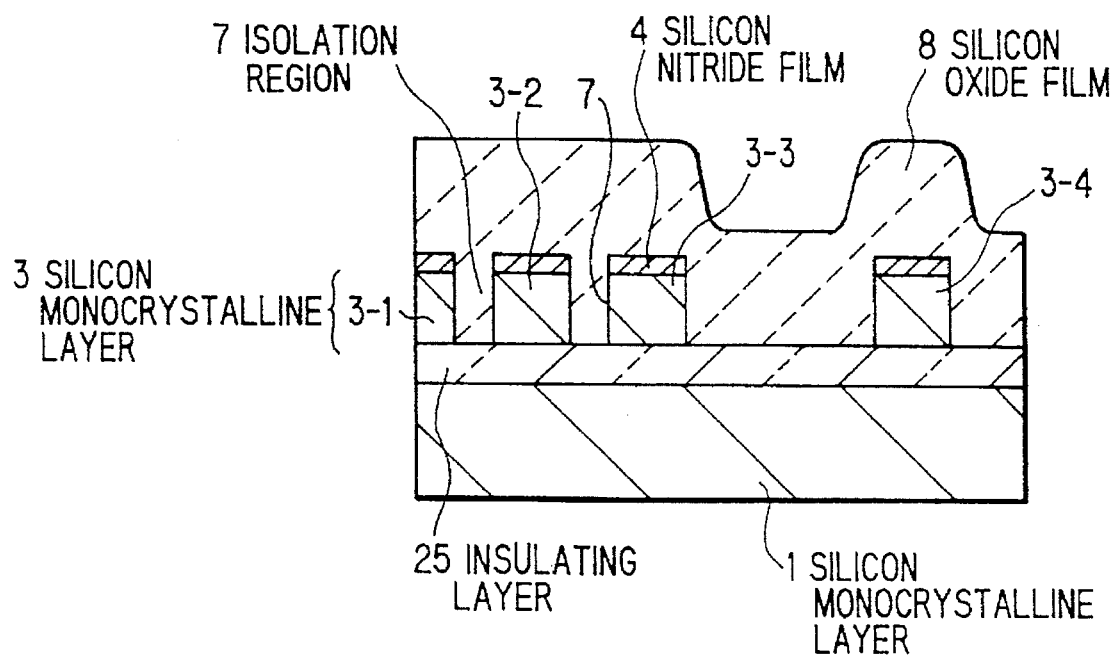
FIGS. 1A and 1B are cross sectional views showing a conventional semiconductor device and the method for making the same.
Figure 1B:
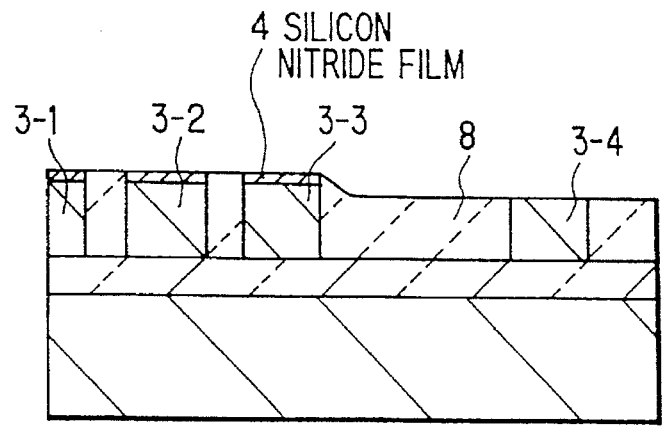

The SOI-type semiconductor device is conventionally made by the process as shown in FIGS. 1A and 1B. At first, as in FIG. 1A, silicon monocrystalline layers 1 and 3 are formed with an insulating layer 25 inserted therebetween by SIMOX (Separation by Implanted Oxygen) method or wafer bonding method. The silicon monocrystalline layer 3 is then selectively removed by dry-etching to provide some element regions 3-1 to 3-4. Thereafter silicon oxide film 8 is deposited thick.

Next, as shown in FIG. 1B, the silicon oxide film 8 is polished to plane the uneven surface. The polishing of the silicon oxide film 8 is conducted by using a polishing plate and a polishing agent of a slurry in which particles of silica are mixed with an alkaline solution. For example, if the diameters of particles of silica are in the range of 20 to 30 nm and suitable conditions of the polishing are selected, the polishing speed of about 0.1 μm can be performed. The polishing can be controlled by silicon nitride film 4 deposited on the element regions 3-1 to 3-4 as a stopper which has a hardness higher than that of the silicon oxide film 8. After the polishing, impurity regions are selectively formed at the element regions 3-1 to 3-4 to provide a transistor, a resistor or the like, followed by wiring to obtain a semiconductor integrated circuit.

In the semiconductor integrated circuit device, the elements such as a transistor, a resistor or the like are not always uniformly disposed in the device, and it may include an element isolated from the other elements due to the design of a circuit or the patterning of a layout. The element 3-4 shown in FIG. 1A is such isolated element. When the silicon oxide film 8 is polished, the resistance to the polishing in the isolated element 3-4 is less than that in the other elements 3-1 to 3-3. Therefore, as shown in FIG. 1B, even if the polishing of the silicon oxide film 8 is stopped when the silicon nitride film 4 on the element regions 3-1 to 3-3 appears, a part of the isolated element 3-4 is already polished, thereby forming an uneven surface.

Next, a semiconductor device and a method of making the same in the first preferred embodiment according to the invention will be explained in FIGS. 2A to 2D and 3A to 3D, wherein like parts are indicated by like reference numerals as used in FIGS. 1A and 1B.

Figure 2A:
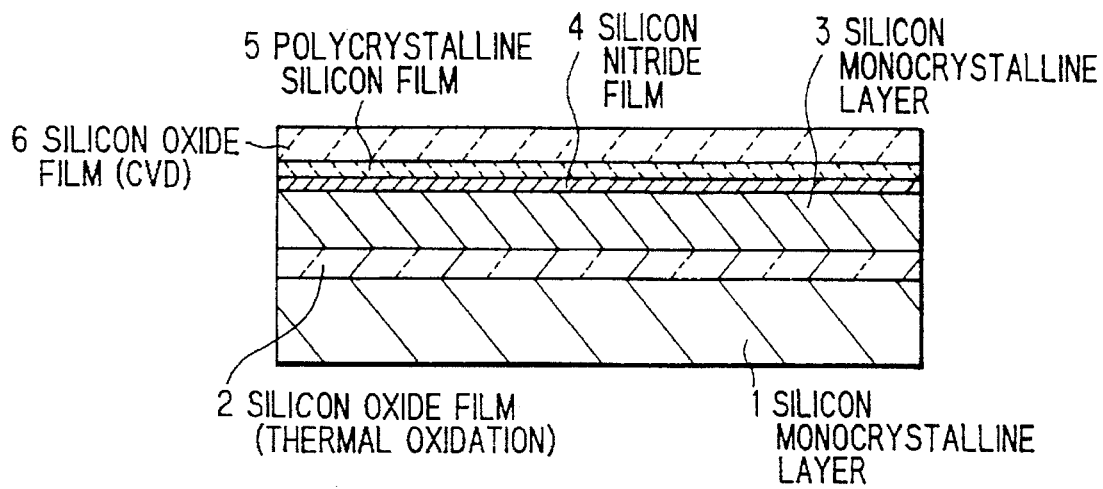
FIGS. 2A to 2D and 3A to 3D are cross sectional views showing a semiconductor device and the method for making the same in a first preferred embodiment according to the invention.

At first, as shown in FIG. 2A, prepared is a SOI substrate in which silicon monocrystalline layers 1 and 3 are formed with silicon oxide film 2 as a insulating layer inserted therebetween, by implanting oxygen ions to the predetermined position inside the monocrystalline substrate by the SIMOX method then applying a thermal treatment thereto. Thereafter, silicon nitride film 4, polycrystalline silicon film 5 and silicon oxide film 6 are formed in that order on the silicon monocrystalline layer 3 by the CVD method. In the case of applying this structure to a bipolar integrated circuit, it is suitable that the silicon monocrystalline layer 3 has a thickness of about 2 μm and the silicon oxide film 2 has a thickness of about 0.3 to 1.0 μm. In this embodiment, the silicon nitride film 4, the polycrystalline silicon film 5 and the silicon oxide film 6 have about 150 nm, about 250 nm and about 500 nm in thickness, respectively. Because this embodiment uses the SIMOX method in which a silicon monocrystalline layer is normally about 0.1 to 0.2 μm in thickness, the silicon monocrystalline layer 3 is thickened by epitaxial growth.

Figure 2B:
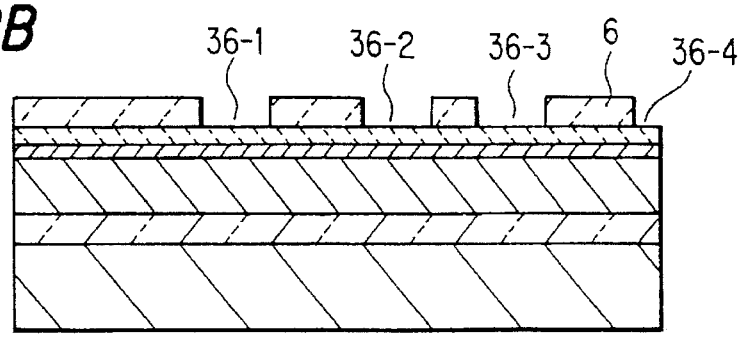

Next, as shown in FIG. 2B, some parts of the silicon oxide film 6, 36-1 to 36-4 are selectively removed by a photolithography technique. Of the removed parts, the parts 36-1 and 36-2 correspond to dummy regions to be formed around isolated element regions according to the invention. Furthermore, in this embodiment, to realize the planing of the entire chip, i.e., not only the isolated element, but also the part where an element region is formed, a part of the silicon oxide film 6 is removed to form a dummy region on the region where the element region is not formed, i.e., non-element-region-existing region.

Namely, in a semiconductor integrated circuit device, non-element-region-existing region can be formed due to designing of a layout of functional blocks which perform an initial object and operation. Herein, the non-element-region-existing region means a place where there is a space about 50 or more μm square between two adjacent regions of a plurarity element regions. In the non-element-region-existing region, no stopper exists against the polishing of an insulating layer which is deposited for the separation of element since no element region is formed thereat. Therefore, the polishing speed becomes higher, and the height of non-element-region-existing region becomes lower than that of an element-existing region. The wire between circuits must be thinner at a gap portion on the border between two region, thereby the life of the semiconductor integrated circuit becomes shorter. To prevent such disadvantage, in this embodiment, the dummy region is also formed on the non-element-region-existing region. However, if the dummy region is simply formed on the non-element-region-existing region, the capacitance between a substrate and the wire formed on the dummy region increases. To reduce the capacitance therebetween, the dummy region is divided into a plurality of regions. Moreover, the divided regions are arranged such that the lower dummy region is placed around the higher dummy region which is as high as the element regions, like the above-mentioned relation between the isolated element region and the dummy region around it. The removed parts 36-3 and 36-4 in the silicon oxide film 6 as shown in FIG. 2B correspond to such lower dummy regions. By such arrangement of the dummy regions to the non-element-region-existing region, the parasitic capacitance of the wire formed thereon is still more reduced.

Figure 2C:
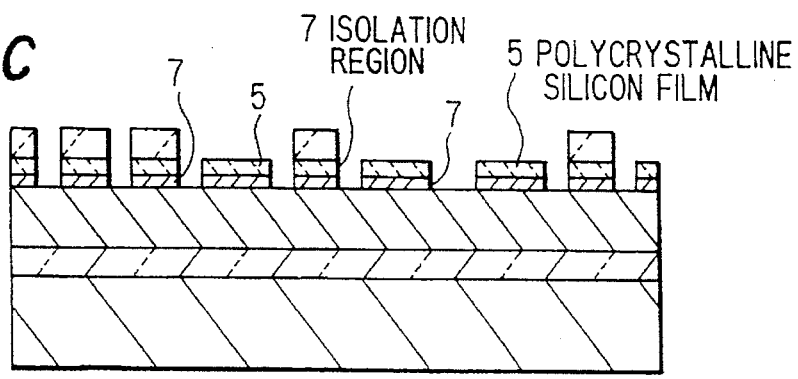

In the following stage, to divide the silicon monocrystalline layer 3 into the dummy regions and the element regions, as shown in FIG. 2C, the silicon oxide film 6, the polycrystalline silicon film 5 and the silicon nitride film 4 are selectively removed in that order by dry-etching to form isolation regions 7.

Figure 2D:
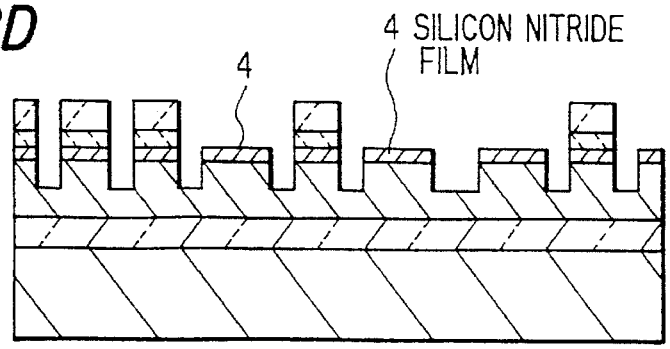

Thereafter, as shown in FIG. 2D, the silicon monocrystalline layer 3 at the isolation regions 7 is removed about 1.0 μm by etching. Herein, the silicon oxide film 6 serves as a mask to protect the parts of the silicon monocrystalline layer 3 to be formed with the element regions and higher dummy regions. On the other hand, the polycrystalline silicon film 5 on which the silicon oxide film 6 is not left, such as polycrystalline silicon film 5 on the lower dummy regions, is removed by etching as well as the silicon monocrystalline layer 3 at the isolation regions 7.

Figure 3A:
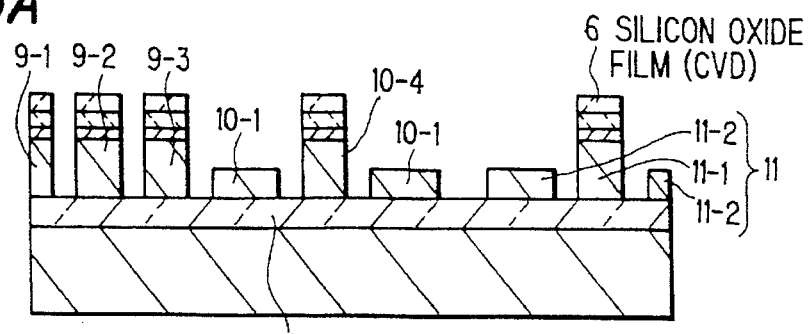

Next, as shown in FIG. 3A, the silicon nitride film 4 on the lower dummy regions is removed by etching. Herein, the silicon oxide film 6 on the element regions and the higher dummy regions is also etched, but all the silicon oxide film 6 thereon is not removed since the silicon oxide film 6 thereon is deposited thick. At the isolation regions 7, the silicon monocrystalline layer 3 is removed by etching to expose the silicon oxide film 2. The silicon monocrystalline layer 3 at dummy regions 10-1 and 11-2 is also removed about 1.0 μm by etching. Thus, a plurality of element regions 9-1 to 9-4 including an isolated element region 9-4, the dummy regions 10-1 surrounding the isolated element region 9-4, and a dummy region 11 which comprises a dummy region 11-1 having the same height as the element regions 9-1 to 9-4 and the lower dummy region 11-2 surrounding the region 11-1 are formed.

Figure 3B:
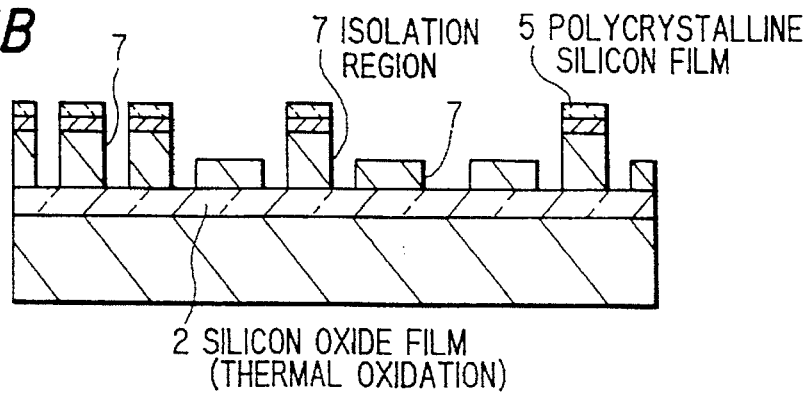

In the following stage, as shown in FIG. 3B, the remaining silicon oxide film 6 is removed by etching to expose the polycrystalline silicon film 5. Herein, since the silicon oxide film 2 is formed by a thermal oxidation technique in which it is rigidly constructed, it is harder than the silicon oxide film 6 formed by a CVD technique and the etching speed thereof is reduced to be about ⅒. Therefore, the silicon oxide film 2 at the isolation regions 7 is hardly removed when the silicon oxide film 6 is removed by etching.

Figure 3C:
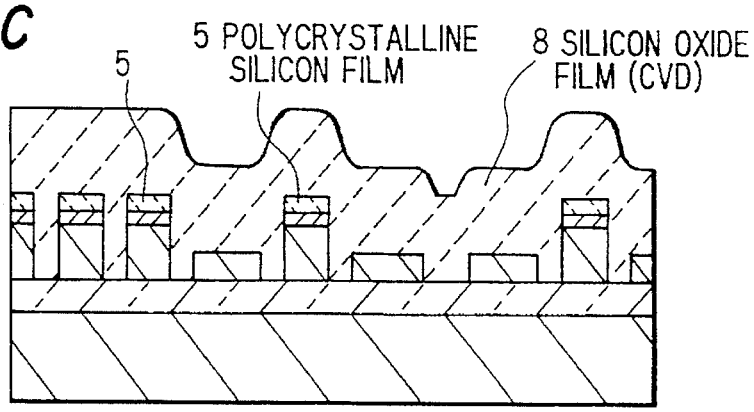

Thereafter, as shown in FIG. 3C, silicon oxide film 8 is deposited on the entire surface. The silicon oxide film 8 is formed such that the top surface of the silicon oxide film 8 directly deposited on the silicon oxide film 3 is higher than the element regions 9-1 to 9-4.

Figure 3D:
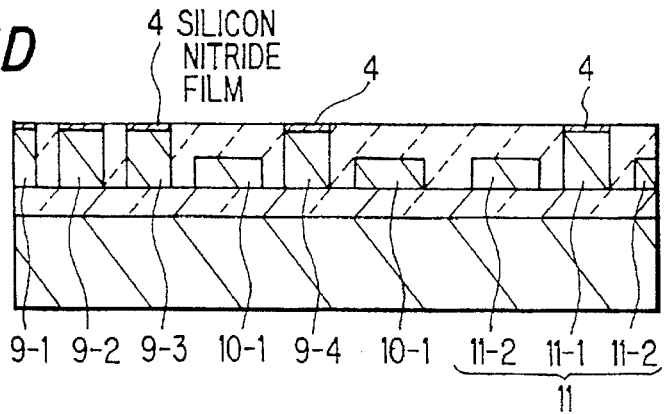

Next, as shown in FIG. 3D, the silicon oxide film 8 is polished to form a plane surface. The method for polishing is the same method as the conventional one. Herein, the silicon nitride film 4 serves as a stopper in the polishing. The polycrystalline silicon film 5 on the element regions 9-1 to 9-4 and the dummy region 11-4 as shown in FIG. 3C is polished together with the silicon oxide film 8 since it is softer than the silicon oxide film 8, i.e., the polishing speed thereof is higher than that in the latter.

In the above polishing process, since the dummy regions 10-1 are surrounding the isolated element region 9-4 and the dummy regions 11-2 are surrounding the dummy region 11-1 in the dummy region 11 formed in the non-element-region-existing region, the resistance against the polishing is uniform as compared with such conventional case that does not employ the dummy region. The polishing of the isolated element region 9-4 is effectively prevented, and the substantial plane surface is realized by providing the dummy region 11. Therefore, when the silicon nitride film 4 is removed and suitable impurity regions are formed to provide elements such as a transistor, a resistor and the like and a wiring is suitably equipped to provide a semiconductor integrated circuit, the plane surface over the entire chip can be obtained, thereby preventing the partial cutting of wire and the production of a thinned part of the film. In addition, high-speed operation can be performed since wire-substrate capacitance is further reduced.

With reference to FIGS. 4A to 4D and 5A to 5D, the second preferred embodiment of the invention will be explained. The semiconductor device in the second embodiment is made such that an insulator for separate element regions is also used to insulate between two or more impurity regions formed in an element region.

Figure 4A:
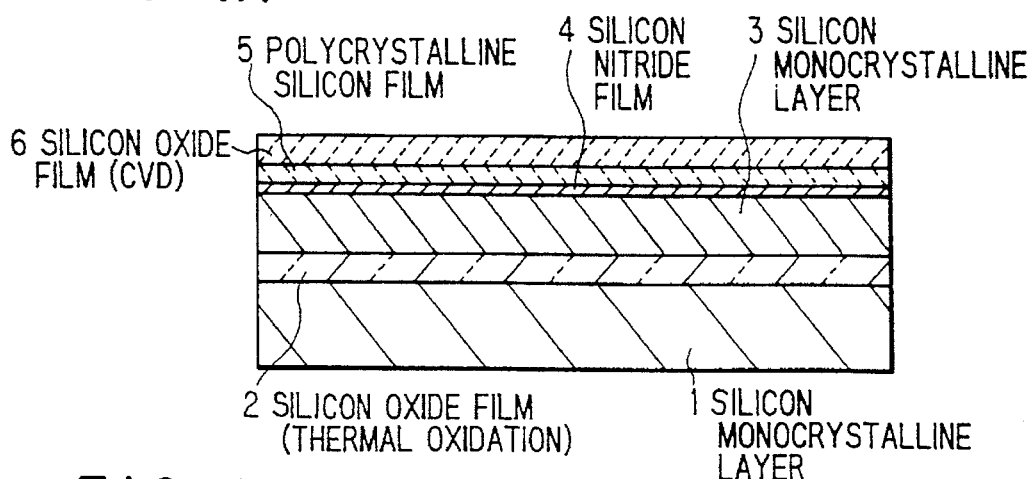
FIGS. 4A to 4D and 5A to 5D are cross sectional views showing a semiconductor device and the method for making the same in a second preferred embodiment according to the invention.
Figure 4B:
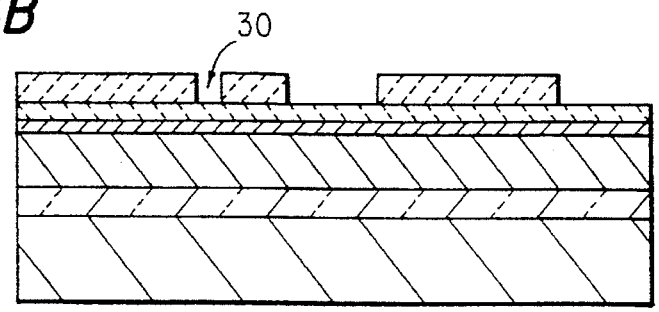

At first, as shown in FIG. 4A, a SOI substrate is prepared similarly as in FIG. 2A. Thereafter, as shown in FIG. 4B, silicon oxide film 6 is selectively removed by a photolithography technique. The selectively removed parts correspond to a dummy region in a non-element-region-existing region or a part for insulating between two or more impurity regions formed in one element region as mentioned above. The part for insulating between two or more impurity regions is in the form of a trench 30 which is formed in a element region 14-2 indicated in FIG. 5A. Herein, an isolated element region as mentioned above is omitted.

Figure 4C:
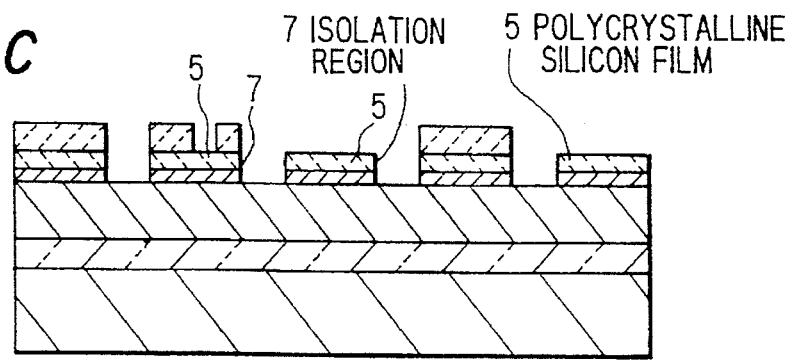

Next, as shown in FIG. 4C, to separate into the element regions and dummy regions, silicon oxide film 6, polycrystalline silicon film 5 and silicon nitride film 4 are in that order removed by etching to form isolation regions 7.

Figure 4D:
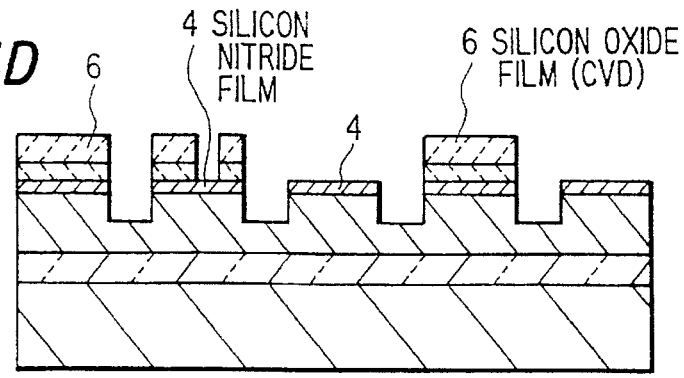

In the following stage, as shown in FIG. 4D, silicon monocrystalline layer 3 at the isolation regions 7 is removed about 1.0 μm by etching. Herein, the silicon oxide film 6 serves as a mask. The polycrystalline silicon film 5 on the insulating part in the element region is also removed.

Figure 5A:
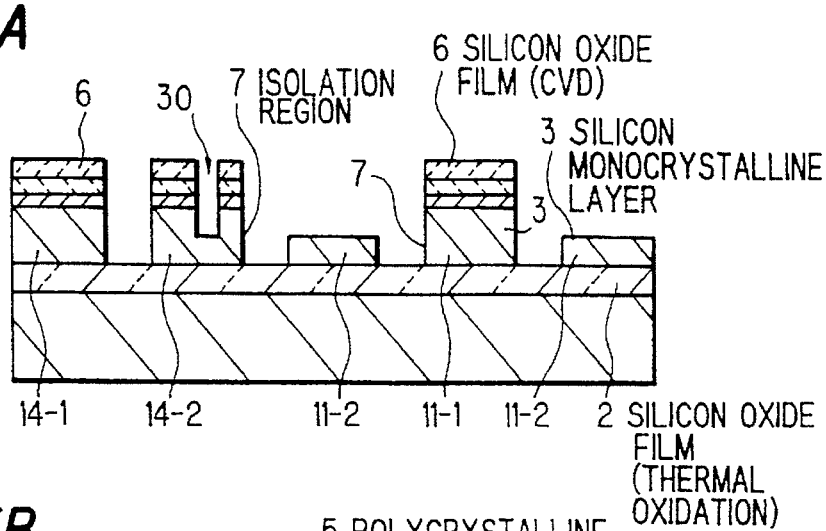

Thereafter, as shown in FIG. 5A, the silicon nitride film 4 is selectively removed by etching. Herein, the silicon oxide film 6 on the element regions and the dummy region 11-1 is also etched, but all the silicon oxide film 6 thereon is not removed since the silicon oxide film 6 thereon is deposited thick. At the isolation regions 7, the silicon monocrystalline layer 3 is removed by etching to expose the silicon oxide film 2. Thus, element regions 14-1 and 14-2 which are separated each other, and a dummy region 11 which comprises dummy regions 11-1 and 11-2 are formed.

The silicon monocrystalline layer 3 under the trench 30 in the element region 14-2 is also removed about 1.0 μm by etching.

Figure 5B:
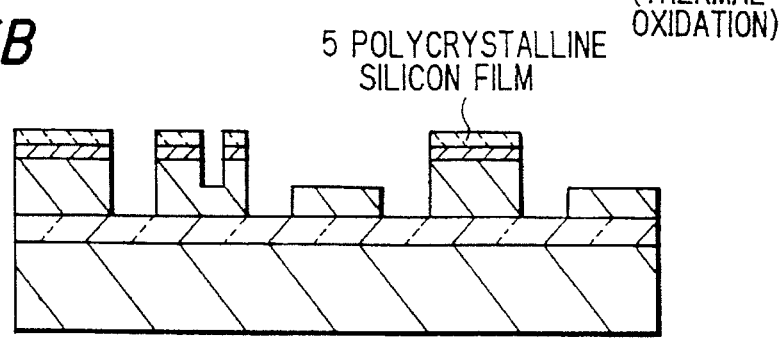

Further, as shown in FIG. 5B, the remaining silicon oxide film 6 is removed to expose the polycrystalline silicon film 5.

Figure 5C:
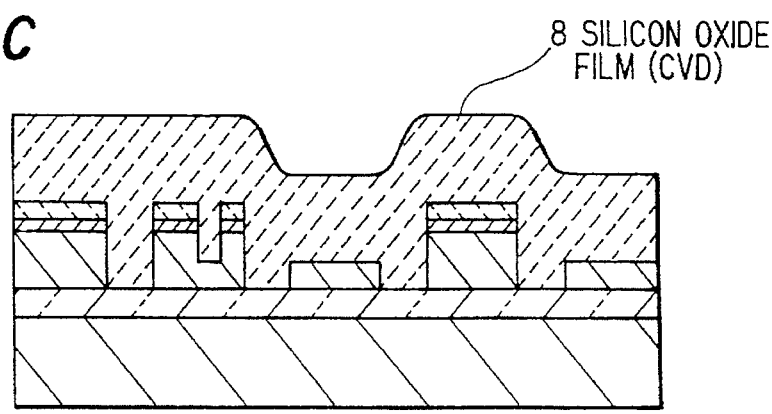
Figure 5D:
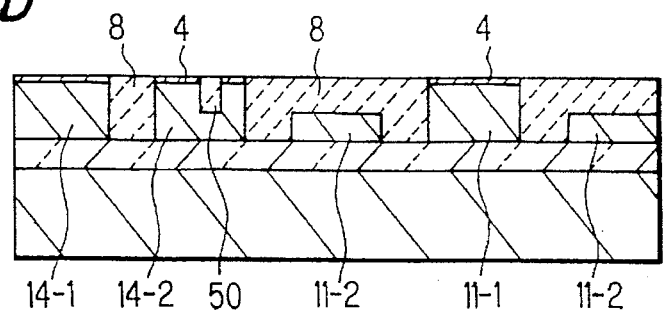

Thereafter, as shown in FIG. 5C, silicon oxide film 8 is deposited on the entire surface. The silicon oxide film 8 is formed such that the top surface of the silicon oxide film 8 directly deposited on the silicon oxide film 3 is higher than the element regions 14-1 and 14-2.

Next, as shown in FIG. 3D, the silicon oxide film 8 is polished to form a plane surface. The method for polishing is the same method as the conventional one. Herein, the silicon nitride film 4 serves as a stopper in the polishing. The silicon nitride film 4 is then removed by wet-etching and a suitable impurity is implanted to the element regions and a wiring is suitably equipped to provide a semiconductor integrated circuit.

Similarly as in the first embodiment, in this embodiment, the plane surface over the entire chip can be obtained, thereby preventing the partial cutting of wire and the production of a thinned part of the film. Further, high-speed operation can be performed since wire-substrate capacitance is further reduced.

Figure 6:
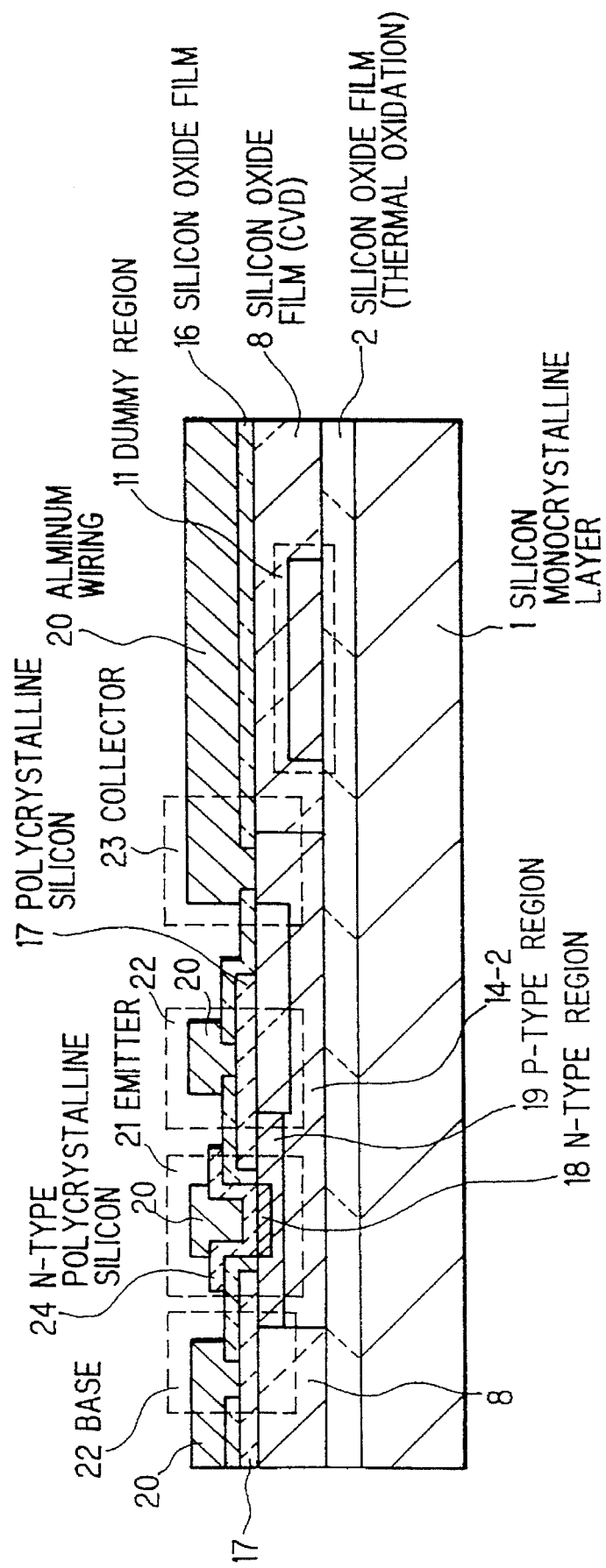
FIG. 6 is a cross sectional view showing the semiconductor device in the second preferred embodiment according to the invention.

In addition, the insulating part 50 which is formed by filling the insulator into the trench 30 formed in the element region 14-2 is also used to insulate between two elements in the element region 14-2. Namely, as shown in FIG. 6, the element region 14-2 is used as a collector region in a bipolar transistor, and a p-type base region 19 is formed by a photolithography technique and an ion implantation using the insulators 8 and 50 as a mask. After annealing, a base electrode 17 of polycrystalline silicon is formed by a photolithography technique. Thereafter, silicon oxide film 16 is formed as insulating film, and the silicon oxide film corresponding to an emitter region 21, a base electrode contact 22 and a collector contact 23 is removed by a photolithography technique. Further, a n-type polycrystalline silicon layer 24 is formed in the emitter region 21, followed by forming a n-type emitter region 18 by thermal diffusion. Thereafter, each wiring at the emitter, base and collector is performed with aluminum electrode wires.

In the bipolar transistor made by the above process, with the silicon oxide film 8 formed under the base electrode 17, the base electrode-collector capacitance can be reduced. Namely, the insulator 50 is utilized in the insulation of base region and base electrode.

In the first and second embodiments, the respective insulators or insulating films can be suitably selected to be used with a suitable material. On the other hand, as in FIG. 2C, the silicon oxide film 6 may be patterned at once, thereafter the silicon oxide film 6 on the dummy region may be removed. Further, though the lower dummy regions are most suitably formed to surround the isolated element region or the higher dummy region, they may be formed to be partially provided with such region.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a semiconductor device, comprising the steps of:

forming a plurality of island semiconductor regions and a dummy semiconductor region which is lower than said island semiconductor regions by partially removing a semiconductor layer on a insulating layer;

depositing an insulator on the entire surface of said insulator layer to cover said island semiconductor region and said dummy semiconductor region; and polishing said insulator near to the top surfaces of said island semiconductor regions.

2. A method for making a semiconductor device, comprising the steps of:

forming a plurality of island semiconductor regions, a first dummy semiconductor region which has a height nearly equal to said island semiconductor regions and a second dummy semiconductor region which is lower than said first dummy semiconductor region by partially removing a semiconductor layer on a insulating layer;

depositing an insulator on the entire surface of said insulator layer including said island semiconductor regions, said first and second dummy semiconductor regions to a height higher than said island semiconductor regions; and polishing said insulator near to the top surfaces of said island semiconductor regions.

3. A method for making a semiconductor device, comprising the steps of:

forming a plurality of island semiconductor regions by partially removing a semiconductor layer on a insulating layer, wherein at least one of said island semiconductor regions is provided with a trench;

depositing an insulator on the entire surface of said insulating layer including said island semiconductor regions to a height higher than said island semiconductor regions; and polishing said insulator near to the top surfaces of said island semiconductor regions;

wherein said insulator is filled between island semiconductor regions and into said trench.

* * * * *